United States Patent
Hale

[19]

[11] Patent Number: 6,005,433
[45] Date of Patent: Dec. 21, 1999

[54] LOW CHARGE INJECTION MOSFET SWITCH

[75] Inventor: Robert Russell Hale, Beaverton, Oreg.

[73] Assignee: Credence Systems Corporation, Fremont, Calif.

[21] Appl. No.: 09/126,696

[22] Filed: Jul. 30, 1998

[51] Int. Cl.[6] .................................................. H03K 17/16
[52] U.S. Cl. .......................... 327/379; 327/401; 327/403
[58] Field of Search .................................... 327/379, 380, 327/401, 402, 403, 404, 53, 66; 323/312, 313, 314, 315; 330/288

[56] References Cited

U.S. PATENT DOCUMENTS

| | | | |
|---|---|---|---|
| 4,749,880 | 6/1988 | Kobatake | 327/78 |
| 4,857,770 | 8/1989 | Partovi et al. | 326/83 |
| 4,890,010 | 12/1989 | Neudeck et al. | 327/108 |
| 5,514,989 | 5/1996 | Sato et al. | 327/109 |
| 5,517,143 | 5/1996 | Gross | 327/108 |
| 5,552,744 | 9/1996 | Burlison et al. | 327/401 |
| 5,561,385 | 10/1996 | Choi | 327/536 |
| 5,905,412 | 5/1999 | Rasmussen | 331/57 |

*Primary Examiner*—Timothy P. Callahan
*Assistant Examiner*—An T. Luu
*Attorney, Agent, or Firm*—Smith-Hill and Bedell

[57] ABSTRACT

When turned on by an input CONTROL signal, a MOSFET transistor switch in accordance with the present invention connects a low impedance voltage source to a moderate to high impedance load. The switch includes a relatively large first MOSFET transistor (Q1), a smaller second MOSFET transistor (Q2), a resistor and a current source. Source terminals of transistors Q1 and Q2 are tied to the voltage source. The load is connected to the drain of Q1 while the current source is connected to the drain of the Q2 and also to the gates of both transistors Q1 and Q2. The resistor links the gates of transistors Q1 and Q2 to the voltage source. When the CONTROL signal is asserted, it turns on the current source, thereby quickly turning transistors Q1 and Q2 on to connect the voltage source to the load. When the control source is de-asserted, the current source turns off. Transistors Q1 and Q2 then turn off at a controlled rate in order to minimize current injection into the load.

21 Claims, 4 Drawing Sheets

LOW CHARGE INJECTION MOSFET SWITCH

BACKGROUND OF THE INVENTION

The present invention relates in general to MOSFET switches for connecting a power supply to an IC and in particular to a method and apparatus for reducing charge injection into the IC when the MOSFET switch is turned off.

DESCRIPTION OF RELATED ART

An increasingly popular integrated circuit test technique involves measuring the power supply current of a CMOS integrated circuit (IC) after it has been driven to a particular state and its current drain has had time to stabilize. The stabilized current drain is also known as the IC's quiescent or static $I_{DD}$ current, "$I_{DDQ}$". A CMOS gate such as an inverter includes one or more NMOS transistors coupling the gate's output to ground ($V_{SS}$) and one or more PMOS transistors coupling the gate's output to a positive voltage source ($V_{DD}$). Under proper IC operation NMOS and PMOS transistors connecting $V_{DD}$ and $V_{SS}$ to the same node turn on alternatively to drive the node high or low depending on the logic state to which the IC has been driven. But when a gate is defective or when an IC's logic is defective, in one or more IC logic states a CMOS transistor and an NMOS transistor linking $V_{DD}$ and $V_{SS}$ to the same node can partially or fully turn on at the same time, thereby providing an abnormally low impedance path from $V_{DD}$ to $V_{SS}$. In a quiescent current test, the current output ($I_{DD}$) of the $V_{DD}$ source is measured to determine if the $I_{DD}$ current remains within acceptable limits when an IC device under test (DUT) is driven to various logic states.

In performing a static current measurement, it is necessary to wait for a time after driving a DUT to a particular state before measuring its $I_{DD}$ current. A CMOS IC draws very little current when it is not actively switching any of its gates from one state to another. However during switching, for example when an inverter's PMOS transistor is starting to turn off and its NMOS transistor is starting to turn on, PMOS and NMOS transistors connecting a node to $V_{DD}$ and $V_{SS}$ are both partially on. The two transistors therefore provide a lower impedance path between $V_{DD}$ and $V_{SS}$ during a switching operation than after a switching operation when one of its PMOS or NMOS transistors is fully on and the other fully off. Accordingly there is a transient spike in the DUT's supply current $I_{DD}$ during a switching operation. Since it is the quiescent current $I_{DDQ}$, the steady state current draw of the DUT when the DUT is between switching operations, that is of interest in determining whether a DUT is defective, we allow time for the $I_{DD}$ current to settle to its steady state level after each switching operation before measuring its quiescent value $I_{DDQ}$.

FIG. 1 illustrates a typical IC tester 10 for performing digital logic tests on a DUT 12 and for also measuring the $I_{DDQ}$ current of DUT 12. Tester 10 includes a logic tester 14 for testing the logic of DUT 12 by supplying digital data to the DUT's input terminals and monitoring DUT output signals to determine whether they match expected states. Tester 10 also includes a power supply 18 producing an output signal (FORCE) providing power to the $V_{DD}$ input terminal of DUT 12 through an $I_{DDQ}$ measurement circuit 20.

$I_{DDQ}$ measurement circuit 20 includes a switch 22 (typically a MOSFET transistor QX) and a resistor $R_S$ linking the FORCE-output of power supply 18 to the $V_{DD}$ input of DUT 12. The $V_{DD}$ signal voltage is fed back to power supply 18 as a SENSE signal. Power supply 18 adjusts its FORCE signal voltage to ensure that $V_{DD}$ remains at the proper level regardless of whether transistor QX is on or off. A pair of capacitors $C_A$ and $C_B$ linking the FORCE and SENSE signals to ground help to regulate $V_{DD}$. A pair of diodes $D_A$ and $D_B$ connected across the source (S) and drain (D) terminals of transistor QX limit the input voltage to analog-to-digital converter (ADC) 24 and limit the difference between the FORCE and SENSE signal voltages, thereby keeping the power supply's feedback loop stable. The diodes clamp the maximum voltage difference to one diode drop, usually about 0.8 volts when using silicon diodes. Many power MOSFETs have built-in diodes which perform the function of diodes $D_A$ and/or $D_B$. During digital logic tests logic tester 14 turns on transistor QX via a control signal (SW_CONT) to its gate (G) so that transistor QX directly couples the FORCE signal to the DUT's $V_{DD}$ terminal. To initiate an $I_{DDQ}$ measurement, logic tester 14 turns off transistor QX to force the $I_{DD}$ current drawn by DUT 12 to pass though resistor $R_s$. When the $I_{DD}$ current has had sufficient time to settle to its quiescent value $I_{DDQ}$, logic tester 14 sends a SAMPLE signal pulse to a analog-to-digital converter (ADC) 24 telling it to sample the voltage across resistor $R_S$ and convert it to digital output data (DATA). The quiescent current $I_{DDQ}$ can be determined by dividing the voltage indicated by the DATA output of DAC 24 by the magnitude of $R_S$.

FIG. 2 illustrates a tester 30 similar to tester 10 of FIG. 1 except that it employs a somewhat different $I_{DDQ}$ measurement system 32. Measurement system 32 also includes a switch 34 (suitably a MOSFET transistor QY) controlled by the SW_CONT signal for coupling the FORCE signal to the DUT's $V_{DD}$ input and a pair of capacitors $C_C$ and $C_D$ coupling each terminal of transistor QY to $V_{SS}$. A differentiator circuit 36 differentiates the $V_{DD}$ signal with respect to time to supply an input signal to an ADC 38. ADC 38 digitizes the differentiator output signal in response to the input SAMPLE signal to produce the DATA output. For simplicity, a SENSE signal feedback system is not shown in FIG. 2.

After driving the DUT to a desired logic state, a logic tester 44 waits a sufficient amount of time for $I_{DD}$ to reach its quiescent value $I_{DDQ}$. It then sets the SW_CONT signal to turn off transistor QY and pulses the SAMPLE signal so that ADC 38 samples the output of differentiator 36 and produces output DATA representing its value. When transistor QY is off, the FORCE signal is disconnected from the DUT so that the $I_{DD}$ current input to the DUT must be supplied by charge stored in capacitor $C_D$ and in the internal capacitance of the DUT. Since $I_{DD}$ is equal to $CdV_{DD}/dt$ where C is the sum of capacitances at the DUT $V_{DD}$ terminal, the DATA output of ADC 38 will be proportional to $I_{DDQ}$. As long as capacitor CD and the DUT have known capacitances, we can compute $I_{DDQ}$ by dividing the DATA value output of ADC 38 by the sum of the those capacitances. Since transistor QY is turned off only after $I_{DD}$ reaches its quiescent value $I_{DDQ}$, then switching transients in the DUT will not affect the $I_{DDQ}$ measurement.

MOSFET transistor switches are often used to implement switch 22 of FIG. 1 or switch 34 of FIG. 2 because they operate quickly and consume little power. A MOSFET transistor's channel stores charge when it turns on. That charge is what makes the channel conductive. In order for the MOSFET to turn off it has to get rid of that stored charge by sending it out its source and drain terminals. The charge that exits the drain terminals gets injected into the DUT (12 or 42). That charge can alter $V_{DD}$ causing a temporary increase or decrease in $I_{DD}$. Tester 10 can handle this problem by allowing $I_{DD}$ more time to settle to its quiescent value $I_{DDQ}$ after opening switch 22 or 34. However the disadvantage in doing so is that the additional wait adds considerable time to the DUT test, particularly when large numbers of $I_{DDQ}$ measurements are being performed on a DUT. Tester 30 makes an inaccurate measurement because the injected change alters $V_{DD}$.

It is therefore beneficial to reduce the amount of charge that switch 22 or 34 injects into the DUT when it turns off. Charge injection into the DUT via the MOSFET's drain is more pronounced when the MOSFET transistor switch turns off quickly, particularly during the later stages of turn off when much of the charge has already left the MOSFET's channel and the channel is not very conductive. During the early stages of turn off, when the channel is highly conductive, most charge exits the MOSFET's source terminal because the power supply at the MOSFET's source has a much lower impedance path to $V_{SS}$ than the DUT. Thus not much charge is injected into the DUT during the early stages of MOSFET turn off. However during the later stages of rapid MOSFET turn off, when its channel is not very conductive, charge residing on the drain side of the channel will exit though the drain because it doesn't have time to migrate though the poorly conducting channel and exit the source terminal.

FIG. 3 illustrates a prior art switch 48 disclosed in U.S. Pat. No. 5,552,744, issued Sep. 3, 1996 to Burlison et al. Switch 48 is an improvement over switch 34 of FIG. 2 because it reduces the amount of charge it injects into the DUT when the switch opens. Switch 48 is formed by a set of N transistors SW1–SWN connected in parallel between FORCE and $V_{DD}$. Transistors SW1–SWN range in size with transistor SW1 being the largest (i.e. having the smallest on impedance) and transistor SWN being the smallest. Each transistor SW1–SWN has a separate control input CTR1–CTRN from the logic tester. To turn off switch 48, the logic tester first quickly turns off transistor SW1 while leaving transistors SW2–SWN on. Although much of the charge stored in transistor SW1 exits through its drain ($V_{DD}$ side) terminal, transistors SW2–SWN are still on and conduct that charge back into the FORCE terminal of the power supply and not much of the charge is injected into the DUT. Transistor SW2 turns off quickly next. Being smaller, less of its charge exits its drain terminal, and transistors SW3–SWN carry that charge away from the DUT. Each remaining smaller transistor SW3–SWN turns off in succession. When the smallest transistor SWN turns off there are no remaining transistors to carry its charge away from the DUT. However since transistor SWN is very small, the amount of charge that it injects into the DUT is small and does not greatly affect $I_{DD}$.

Switch 48 has some disadvantages. It still can have a significant injection of charge into the DUT after each transistor SW1–SWN turns off. Also switch 48 requires sophisticated control logic in which the timing of the CTR1–CTRN signals is critical and may be difficult to calibrate.

What is needed is a switch that can be used in place of switches 22 and 34 of FIGS. 1 and 2 that does not inject much charge into DUTs 12 and 42 as it switches to its high impedance state and which is relatively easy to control.

SUMMARY OF THE INVENTION

When turned on by an input CONTROL signal, a MOSFET transistor switch in accordance with the present invention connects a low impedance voltage source to a moderate to high impedance load. When the CONTROL signal signals the switch to turn off, the switch turns off at a controlled rate to minimize charge injection into the load.

The switch includes a relatively large first MOSFET transistor (Q1), a smaller second MOSFET transistor (Q2), a resistor and a current source. Source terminals of transistors Q1 and Q2 are tied to the voltage source. The load is connected to the drain of transistor Q1 while the current source is connected to the drain of the transistor Q2 and also to the gates of both transistors Q1 and Q2. The resistor links the gates of transistors Q1 and Q2 to the voltage source. The CONTROL signal turns the current source on in order to signal the switch to connect the voltage source to the load and turns the current source off to signal the switch to disconnect the voltage source from the load.

When the CONTROL signal turns the current source on, the current source's output current passes through the resistor causing a voltage build-up at the gates of transistors Q1 and Q2 and turning them on. Transistor Q1 then provides a low impedance path between the voltage source and the load.

When the CONTROL signal turns off the current source, the inherent gate-to-source capacitance of transistors Q1 and Q2 must discharge before transistors Q1 and Q2 can turn off. Since the drain of transistor Q2 is connected to its gate, the discharge rate of the gate capacitance is initially rapid because transistor Q2 initially provides a low impedance path for that charge into the voltage source. However as the gate capacitance loses charge, the voltage at the gates of, transistors Q1 and Q2 declines. Transistor Q2 becomes less conductive and cannot drain the gate capacitance as quickly. Thus the gate-to-drain impedances of transistors Q1 and Q2 initially increase rapidly after the current source turns off but at progressively slower rates thereafter.

Transistor Q1 stores charge in its channel when it is on and has to get rid of that charge when it turns off. During the early, rapid portion of transistor Q1 turn off, most of that charge exits the source of transistor Q1 and enters the voltage source because the voltage source has lower impedance than the load and because the channel of Q1, being still highly conductive, can easily move charge from anywhere in its channel toward its source. During the later stages of transistor Q1 turn off when its channel impedance is high, it cannot support a large flow of charge from the drain area of its channel towards its source terminal. However since transistor Q2 progressively slows the rate of transistor Q1 turn off, the rate at which charge exits the channel progressively slows to levels that the channel can support. Thus relatively little charge is injected into the load at the drain side of the transistor Q1 channel.

It is accordingly an object of the invention to provide a transistor switch for disconnecting a low impedance voltage source to a moderate to high impedance load at a controlled rate to minimize charge injection into the load.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

FIGS. 1 and 2 illustrate typical prior art testers for carrying digital logic tests on an integrated circuit and for also measuring the $I_{DDQ}$ current of the integrated circuit, FIG. 3 illustrates a prior art switch that may employed in $I_{DD}$ measurement circuits of the testers of FIGS. 1 and 2, and FIGS. 4–9 illustrate alternative embodiments of a low charge injection switch in accordance with the present invention that may be employed in the $I^{DDQ}$ measurement circuits of FIGS. 1 and 2.

DESCRIPTION OF THE PREFERRED EMBODIMENT(S)

Figure 1:
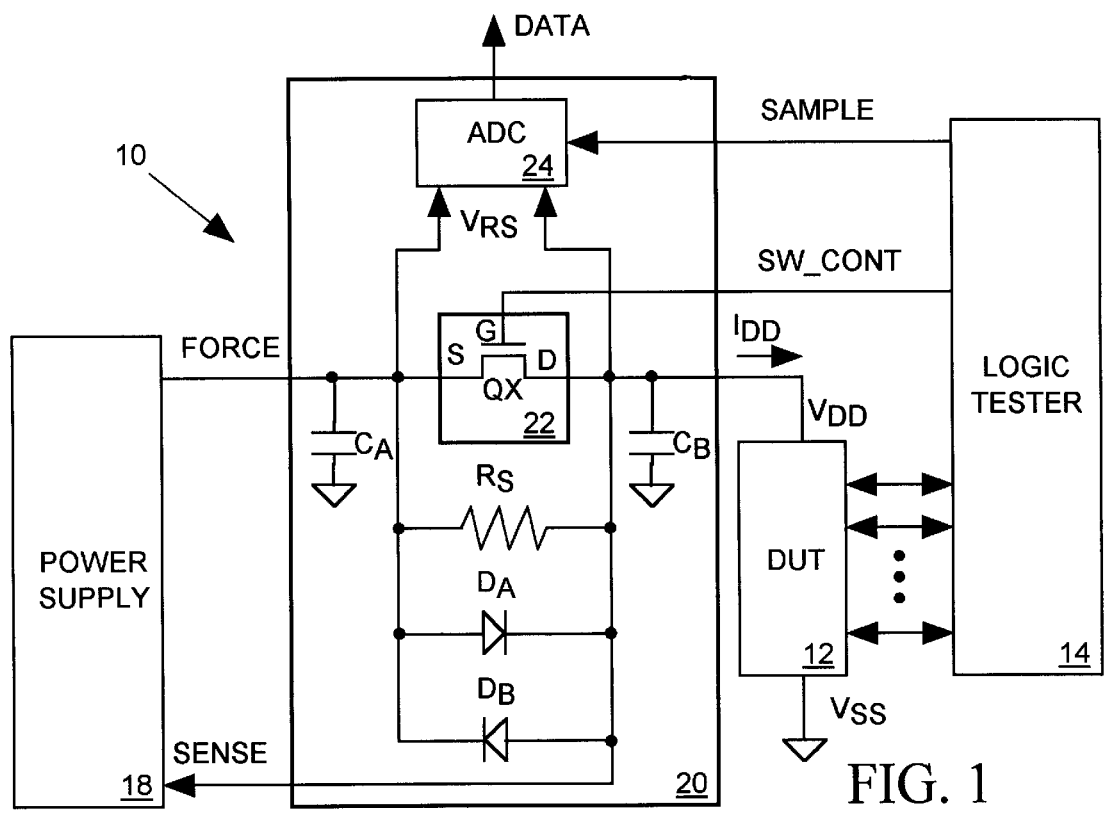
Figure 2:
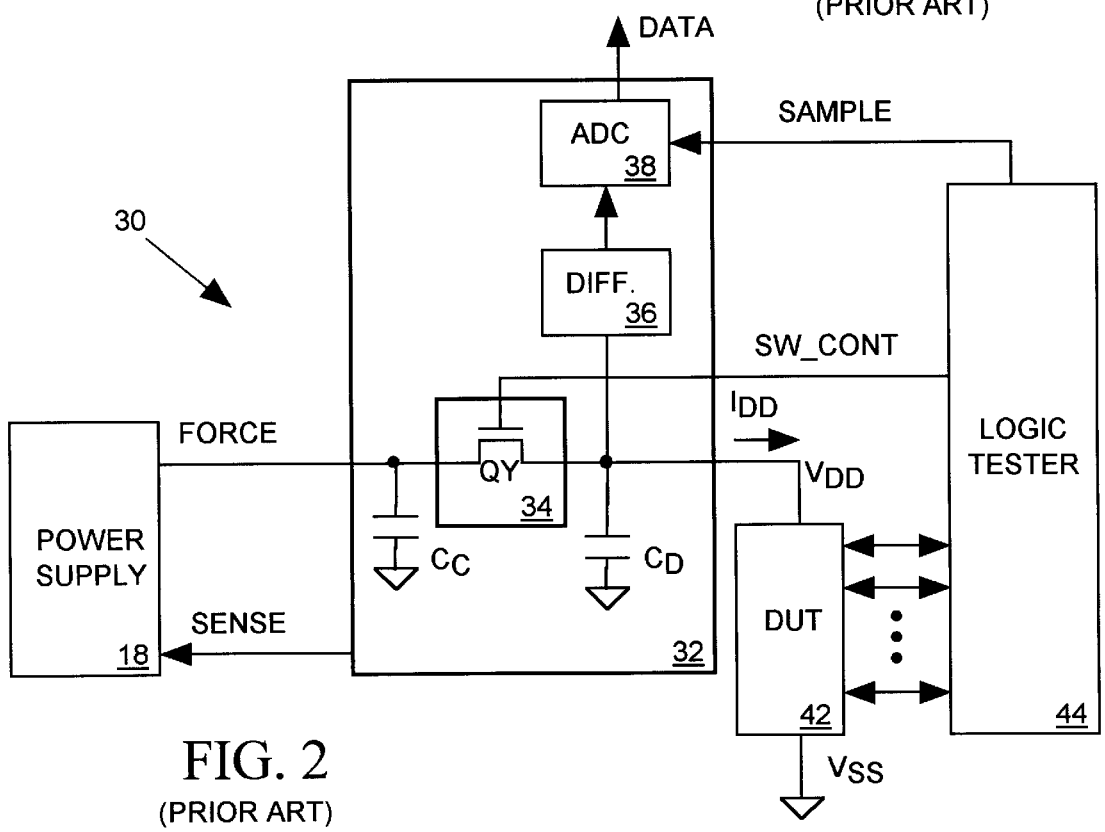
Figure 3:
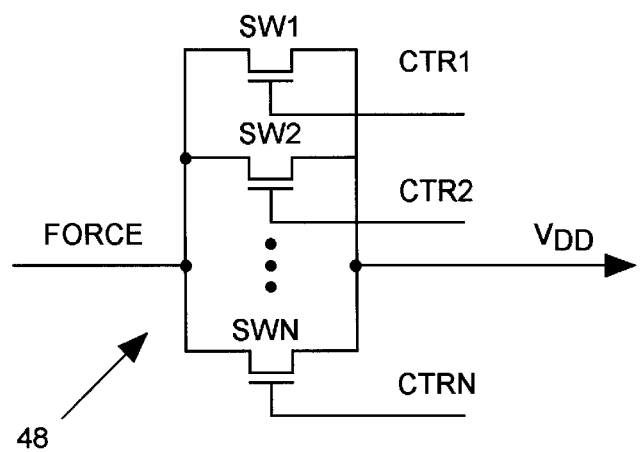
Figure 4:
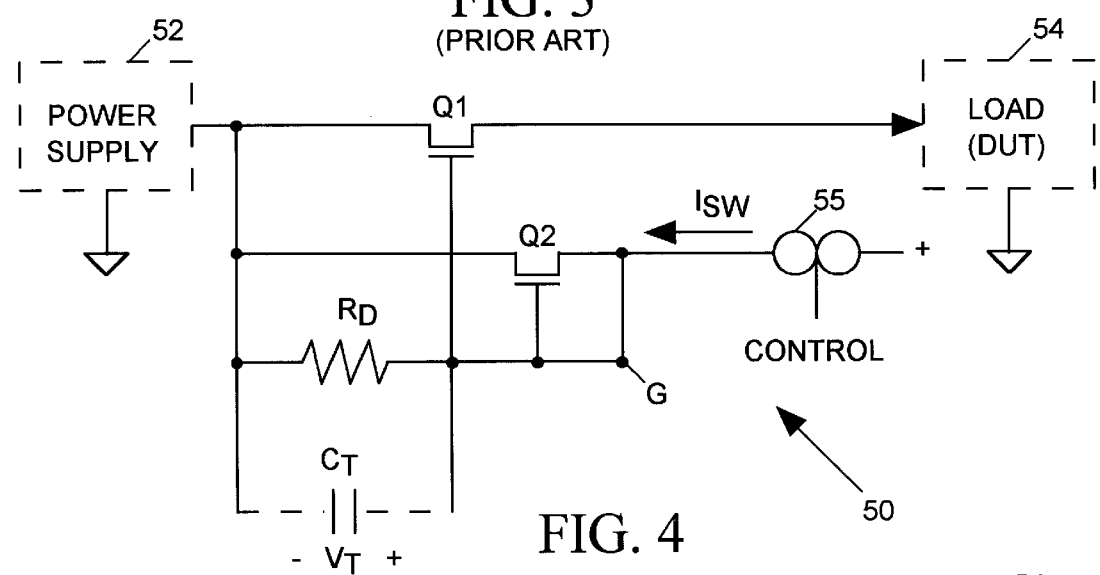

FIG. 4 illustrates a low charge injection MOSFET switch 50 in accordance with the present invention for selectively connecting a low impedance power source to a moderate to high impedance load. Switch 50 is suitable for use as an improved switch 22 or 34 in the $I_{DDQ}$ measurement circuits 20 or 32 of FIGS. 1 or 2. When turned on by an input CONTROL signal, switch 50 connects a low impedance power source 52 to a moderate to high impedance load 54 (such as DUT 12 or 42 of FIG. 1 or 2). When the CONTROL signal signals switch 50 to turn off, switch 50 turns off with minimal charge injection into load 54.

Switch 50 includes a relatively large first MOSFET transistor (Q1), a smaller second MOSFET transistor (Q2), a resistor $R_D$ and a current source 55. Source terminals of transistors Q1 and Q2 are tied to power source 52. Load 54 is connected to the drain of transistor Q1 and current source 55 is connected to the drain of the transistor Q2 and also to the gates of both transistors Q1 and Q2. Resistor $R_D$ links the gates of transistor Q1 and Q2 to power source 52. The CONTROL signal turns current source 55 on when switch 50 is to connect power source 52 to load 54 and turns current source 55 off when switch 50 is to disconnect power source 52 from load 54.

When the CONTROL signal turns current source 55 on, the current source's output current $I_{SW}$ divides between $R_D$ and the drain-to-source path of transistor Q2. Transistor Q2 and the magnitude of $I_{SW}$ are sized so that the voltage developed across $R_D$ is high enough to turn the larger transistor Q1 on to the degree at which the impedance of transistor Q1 is suitably low. $I_{SW}$ is sized to allow for current shunted through $R_D$, but the shunted current is relatively small. Thus when the CONTROL signal turns current source 55 on, both transistors Q1 and Q2 turn on with the same gate-to-source voltage $V_T$. The total gate-to-source capacitance $C_T$ of transistors Q1 and Q2 charges to $V_T$. Current $I_{SW}$ flows through transistor Q2 and $R_D$ into power source 52 and does not affect load 54.

When the CONTROL signal turns off current source 55, the voltage $V_T$ across $C_T$ begins to fall as $R_D$ and transistor Q2 begin to discharge $C_T$. The rate at which $C_T$ discharges is initially rapid because transistor Q2 initially provides a very low impedance path for that charge into power source 52. However as $C_T$ loses charge, the voltage at node G declines and transistor Q2 starts to turn off. As transistor Q2 begins to turn off it becomes less conductive and carries the charge away from node G less quickly. When the voltage at node G reaches the threshold voltage of transistor Q2, transistor Q2 no longer helps discharge $C_T$. Thereafter capacitance $C_T$ discharges only through $R_D$ at a controlled rate determined by the magnitudes of $R_D$ and $C_T$.

Since the gate of transistor Q1 is tied to the gate of transistor Q2, the impedance of the transistor Q1 begins to increase rapidly after CONTROL signal turns $I_{SW}$ off. But the rate of transistor Q1 impedance increase progressively declines with time. Due to subthreshold conduction, transistor Q1 is not quite off when $V_T$ falls to its threshold voltage. Thus its channel remains conductive until the $V_T$ voltage has decreased to well below the threshold voltage.

Transistor Q1 stores charge in its channel when it is on and has to get rid of that charge either through its drain or its source as it turns off. During the early, rapid portion of transistor Q1 turn off, most of that charge exits the source of transistor Q1 and enters power source 52 because the power source has lower impedance than load 54 and because the channel of transistor Q1, being still highly conductive, can easily move charge toward its source. During the later stages of transistor Q1 turn off when its channel impedance is high, transistor Q1 cannot support a large flow of charge from the drain area of its channel towards its source terminal. If transistor Q1 were to continue to turn off rapidly, a significant portion of its channel charge would exit its drain and be injected into load 54 even though load 54 has higher impedance than power source 52. However since transistor Q2 progressively slows the rate of transistor Q1 turn off as the impedance of transistor Q1 rises, the rate at which charge exits the channel progressively slows to levels that the channel of transistor Q1 is capable of delivering to power source 52. Thus transistor Q1 injects relatively little charge into load 54.

Alternative Embodiments

Figure 5:
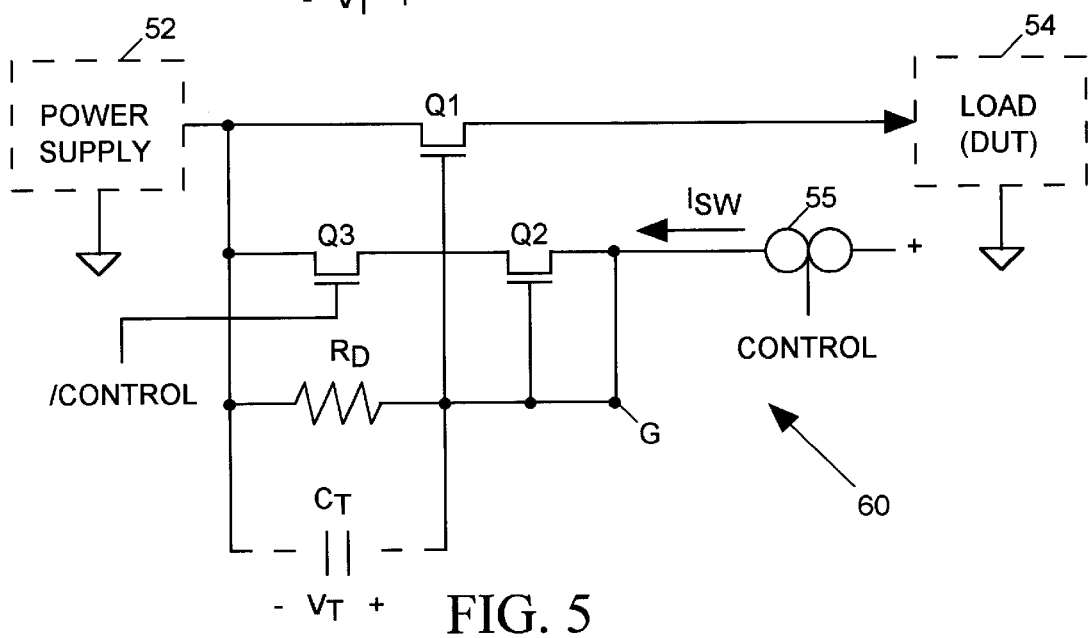
Figure 6:
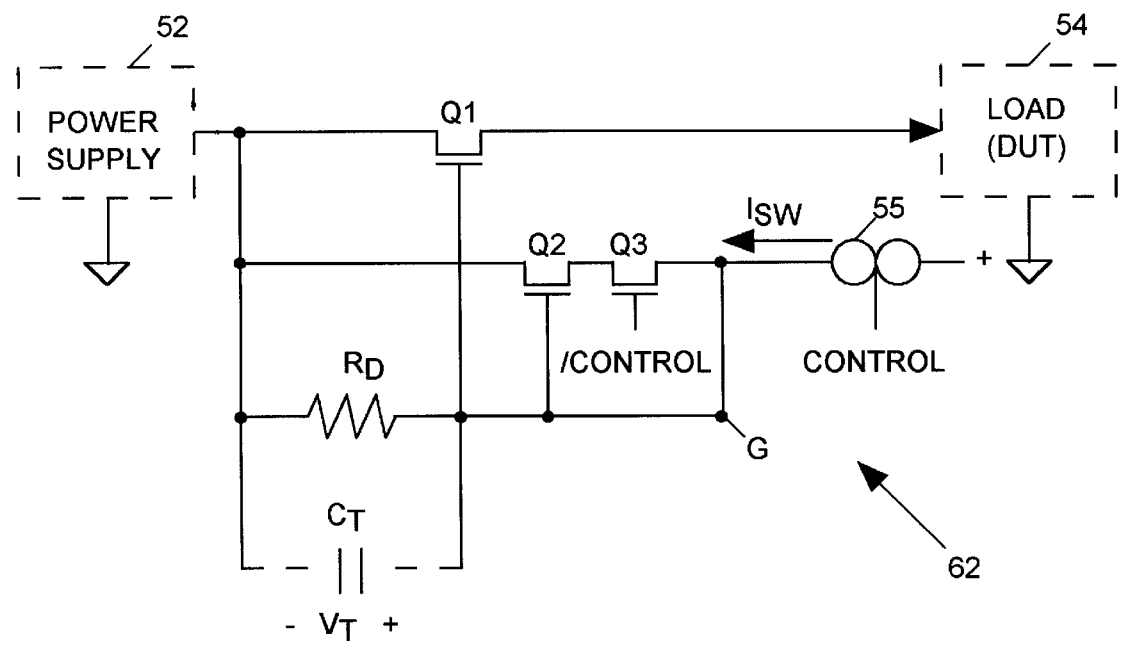

FIG. 5 illustrates an improved switch 60 similar to switch 50 of FIG. 4 except that an additional transistor Q3 controlled by another input signal (/CONTROL) is inserted between the source of transistor Q2 and power source 52. FIG. 6 illustrates an improved switch 62 also similar to switch 60 of FIG. 5 except that the additional transistor Q3 is inserted between the drain of transistor Q2 and node G. The /CONTROL signal is the complement of the CONTROL signal so that it is deasserted when CONTROL is asserted and asserted when CONTROL is de-asserted. Thus transistor Q3 turns off when transistor Q2 turns on and turns off when transistor Q2 turns on. In either switch 60 or 62, transistor Q3 turns off when source 55 is on and turns on when the source 55 turns off. When transistor Q3 is off it prevents flow of current $I_{SW}$ though transistor Q2, thereby eliminating power dissipation in transistor Q2, reducing the magnitude of $I_{SW}$ needed to keep transistor Q1 on, and lowering the amount of current power source 52 must absorb. Transistor Q3 also reduces the turn on time of transistor Q1 because a greater amount of current $I_{SW}$ is available for charging $C_T$. Transistor Q3 should be sized so that its impedance, when on, is a little less than the minimum impedance of transistor Q2. This permits transistor Q2 to operate as described above while $C_T$ is being discharged. Transistor Q3 may be of smaller size, but a smaller transistor Q3 will slow the turn off time of transistor Q1. This may be advantageous if transistors Q1 and Q2 do not have matching threshold voltages.

Figure 7:
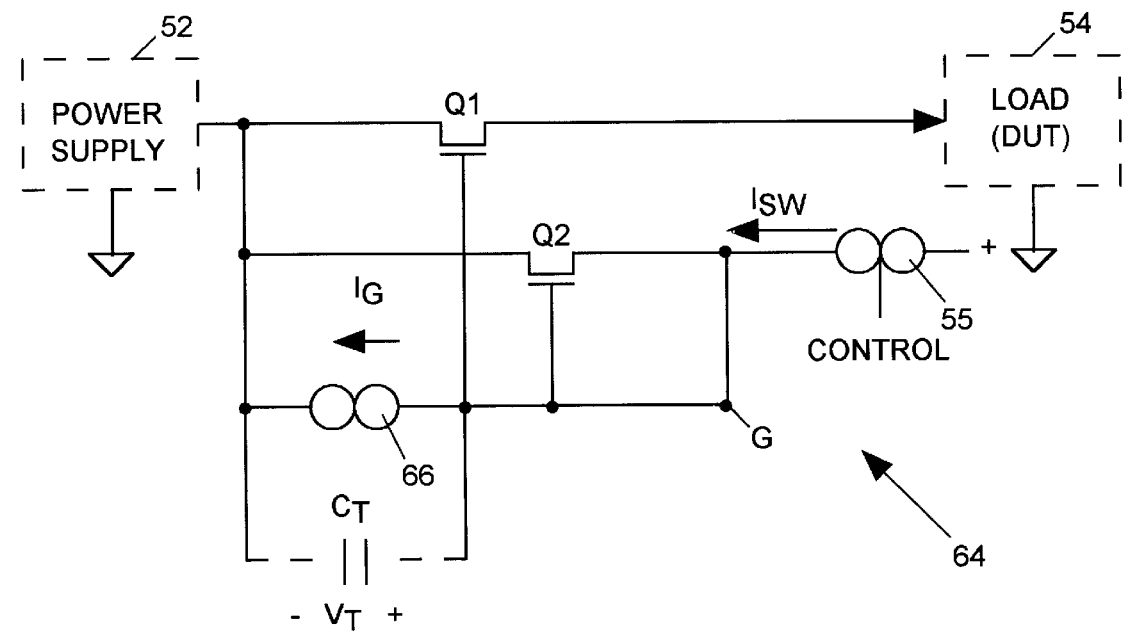

FIG. 7 illustrates an improved switch 64 similar to switch 50 of FIG. 4 except that resistor $R_D$ of FIG. 4 has been replaced in switch 64 by a constant current circuit or device 66 that provides a constant current $I_G$ between node G and power supply 52. During the latter stages of transistor Q1 turn off, the rate at which resistor $R_D$ of FIG. 4 discharges $C_T$, and therefore the rate at which transistor Q1 turns off, decreases with time. Constant current device 66 ensures that $C_T$ continues to discharge at a minimum rate determined by the magnitude of the constant current drawn by device 66, thereby speeding transistor Q1 turn off. The magnitude of the current drawn by device 66 is selected to be small enough to prevent significant charge injection into load 54.

Figure 8:
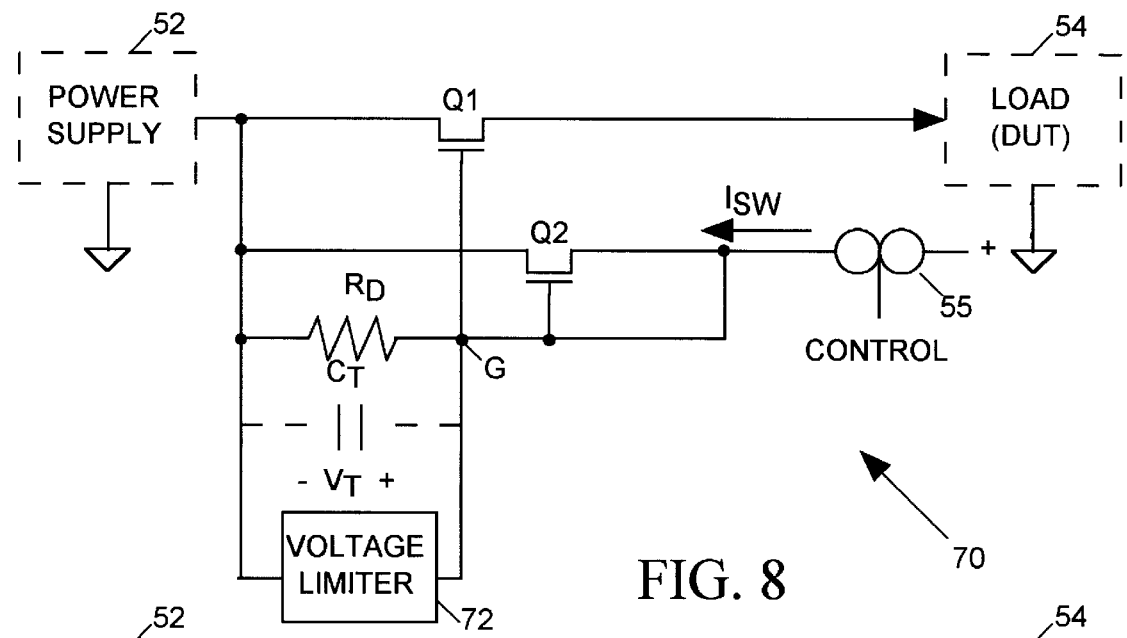

FIG. 8 illustrates an improved switch 70 similar to switch 50 of FIG. 4 except a voltage limiter 72 (such as for example, a zener diode) is placed across capacitor $C_T$. Voltage limiter 72 is sized to prevent transistor Q1 from turning on any more than is required to reduce is impedance to a level that is sufficient to allow power source 52 to appropriately drive load 54. By limiting voltage $V_T$ across $C_T$ when transistor Q1 is on, we limit the amount of $C_T$ charge that must be removed during transistor Q1 turn off, thereby increasing the speed with which transistor Q1 can turn off.

Figure 9:
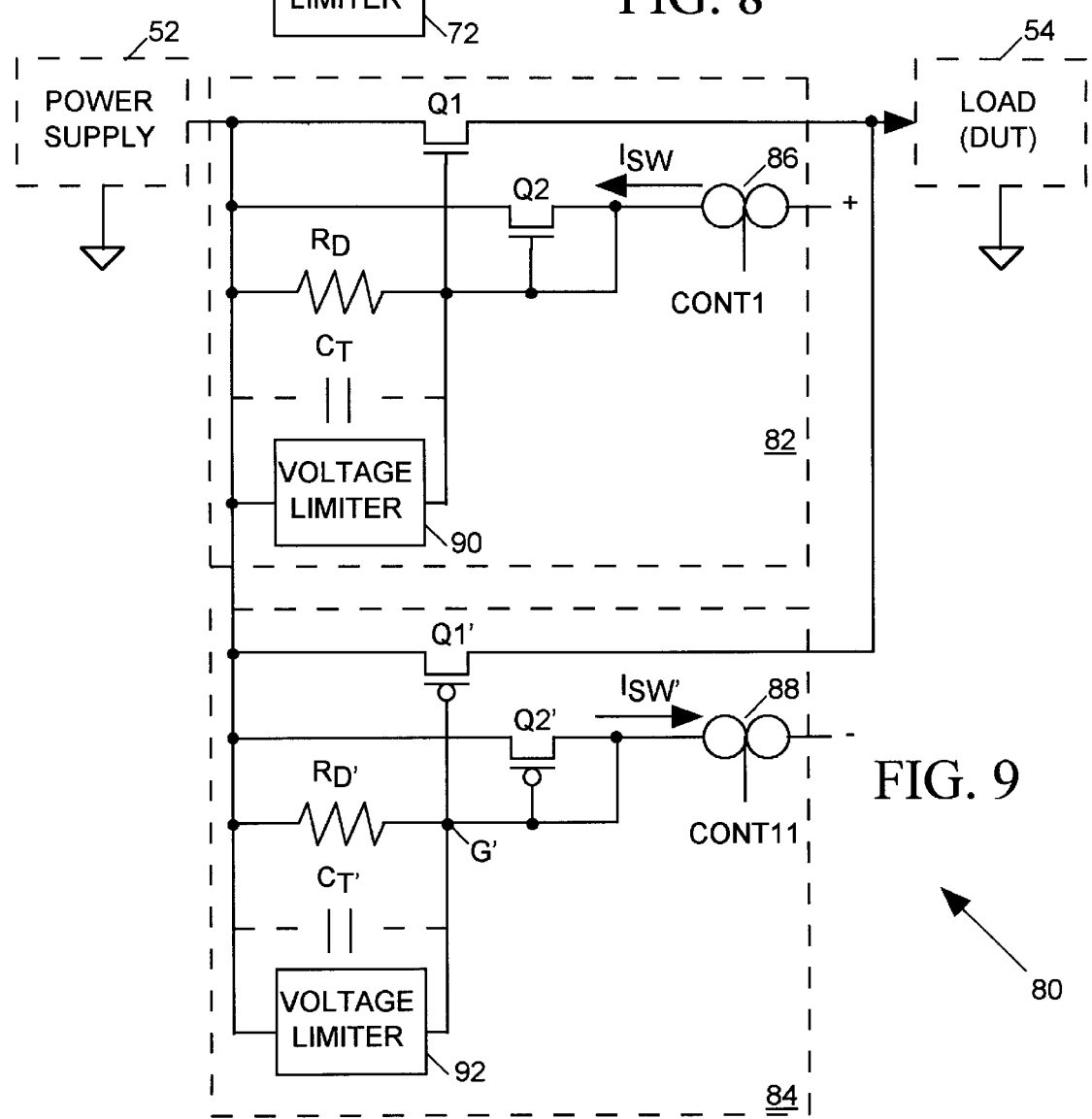

FIG. 9 illustrates a complementary switch 80 including an NMOS switch 82 similar to switch 70 of FIG. 8 and a complimentary PMOS switch 84 that is generally similar to switch 70 of FIG. 8 except that it uses PMOS instead of NMOS transistors and employs a current source 88 that draws out of a node G' instead of supplying it into the node. Voltage limiters 90 and 92 improve switch speed but may be eliminated.

Switch 80 can minimize the amount of current power source 52 must sink. If currents $I_{SW}$ and $I_{SW'}$, produced by current sources 86 and 88 are of equal magnitude, no net current flows to or from the power source 52 due to $I_{SW}$ or $I_{SW'}$. If currents $I_{SW}$ and $I_{SW'}$, are not equal, only their difference flows into or out of power source 52. Since the channel charge and overlap capacitance charge of transistors Q1 and Q1' act in opposing directions, they tend to cancel each other to further reduce charge injection when the transistors are appropriately sized. While the foregoing specification has described preferred embodiment(s) of the present invention, one skilled in the art may make many modifications to the preferred embodiment without departing from the invention in its broader aspects. For example the voltage limiter illustrated in FIG. 8 could be added to the switches of FIGS. 5–7 and the switches of FIGS. 4–7 could be also provided in complementary form analogous to the same manner in which switch 8 of FIG. 4 was implemented form in FIG. 9. The appended claims therefore are intended to cover all such modifications as fall within the true scope and spirit of the invention.

What is claimed is:

1. A low charge injection switch for connecting a load to a power source when an input CONTROL signal is asserted and for disconnecting the load from the power source when the CONTROL signal is de-asserted, the switch comprising:

a first circuit node (G), a first current source (86), receiving said CONTROL signal as input, for supplying a first current ($I_{SW}$) to said first circuit node only when said CONTROL signal is asserted, a first transistor (Q1) having a first drain connected to said load, a first source connected directly to said power source, and a first gate connected to said first circuit node, a second transistor (Q2) having a second drain and a second gate connected to said first circuit node, and a second source connected to said power source, and first conductive means connected for conducting a second current between said power source and said first circuit node.

2. The low charge injection switch in accordance with claim 1 wherein said first conductive means comprises a resistor ($R_D$) connected between said power source and said first circuit node.

3. The low charge injection switch in accordance with claim 1 wherein said first conductive means comprises means (66) for supplying a constant current ($I_G$) between said power source and said first circuit node.

4. The low charge injection switch in accordance with claim 1 wherein said first and second transistors are MOSFET transistors.

5. The low charge injection switch in accordance with claim 4 wherein said first transistor is substantially larger than said second transistor.

6. The low charge injection switch in accordance with claim 1 further comprising a voltage limiter connected between said power source and said first circuit node.

7. The low charge injection switch in accordance with claim 1 wherein said first conductive means comprises a resistor ($R_D$) connected between said power source and said first circuit node, and wherein said first and second transistors are MOSFET transistors.

8. The low charge injection switch in accordance with claim 7 further comprising a voltage limiter connected between said power source and said first circuit node.

9. The low charge injection switch in accordance with claim 1 further comprising a voltage limiter connected between said power source and said circuit node, wherein said first conductive means comprises means (66) for supplying a constant current ($I_G$) between said power source and said first circuit node, and wherein said first and second transistors are MOSFET transistors.

10. A low charge injection switch for connecting a load to a power source when an input CONTROL signal is asserted and for disconnecting the load from the power source when the CONTROL signal is de-asserted, the switch comprising:

a first circuit node (G), a first current source (86), receiving said CONTROL signal as input, for supplying a first current ($I_{SW}$) to said first circuit node only when said CONTROL signal is asserted;

a first transistor (Q1) having a first drain connected to said load, a first source connected to said power source, and a first gate connected to said first circuit node;

a second transistor (Q2) having a second drain and a second gate connected to said first circuit node, and a second source connected to said power source;

first conductive means connected for conducting a second current between said power source and said first circuit node;

a second circuit node (G');

a second current source (88) receiving a second CONTROL signal as input for drawing a second current ($I_{SW'}$) from said second circuit node only when said second CONTROL signal is asserted;

a third transistor (Q1') having a third drain connected to said load, a third source connected to said power source, and a third gate connected to said second circuit node;

a fourth transistor (Q2') having a fourth drain and a fourth gate connected to said second circuit node, and a fourth source connected to said power source; and second conductive means connected between said power source and said second circuit node; and wherein said first and second transistors are NMOS transistors and wherein said third and fourth transistors are PMOS transistors.

11. The low charge injection switch in accordance with claim 10 wherein said first and second currents are substantially similar in magnitude.

12. The low charge injection switch in accordance with claim 10 wherein said first conductive means comprises a first resistor ($R_D$) connected between said power source and said circuit node, and wherein said second conductive comprises a second resistor $R_{D'}$ connected between said power source and said second circuit node.

13. The low charge injection switch in accordance with claim 10 wherein said first transistor is substantially larger than said second transistor, wherein said third transistors is substantially larger than said fourth transistors.

14. The low charge injection switch in accordance with claim 10 further comprising a voltage limiter connected between said power source and said circuit node.

15. A low charge injection switch for connecting a load to a power source when an input first control signal (CONTROL) is asserted and for disconnecting the load from the power source when the first control signal is de-asserted, the switch receiving said first control signal and also receiving a complementary second control signal (\CONTROL), the switch comprising:

a circuit node (G), a current source, receiving said CONTROL signal as input, for supplying a first current ($I_{SW}$) to said circuit node only when said CONTROL signal is asserted, a first transistor (Q1) having a first drain connected to said load, a first source connected to said power source, and a first gate connected to said circuit node, a second transistor (Q2) having a second drain connected to said circuit node, and having a second gate, and a second source, a third transistor (Q3) having a third drain connected to said second source, having a third source connected to said power source, and having a third gate, conductive means connected for conducting a second current between said power source and said circuit node, wherein one of said second and third gates receives said second control signal and the other of said second and third gates is connected to said circuit node.

16. The low charge injection switch in accordance with claim 15 wherein said conductive means comprises a resistor ($R_D$) connected between said power source and said circuit node.

17. The low charge injection switch in accordance with claim 15 wherein said conductive means comprises means (66) for supplying a constant current ($I_G$) between said power source and said circuit node.

18. The low charge injection switch in accordance with claim 15 wherein said first, second and third transistors are MOSFET transistors.

19. The low charge injection switch in accordance with claim 18 wherein said first transistor is substantially larger than said second and third transistors.

20. The low charge injection switch in accordance with claim 19 wherein one of said second and third transistors is substantially larger than the other of said second and third transistors.

21. The low charge injection switch in accordance with claim 15 further comprising a voltage limiter connected between said power source and said circuit node.

* * * * *